(12) United States Patent
Yoshida et al.

(10) Patent No.: US 6,603,785 B2
(45) Date of Patent: Aug. 5, 2003

(54) SEMICONDUCTOR LASER DEVICE

(75) Inventors: Junji Yoshida, Tokyo (JP); Naoki Tsukiji, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/880,064

(22) Filed: Jun. 14, 2001

(65) Prior Publication Data

US 2001/0053169 A1 Dec. 20, 2001

(30) Foreign Application Priority Data

Jun. 16, 2000 (JP) .................................. 2000-182167

(51) Int. Cl.[7] ................................................ H01S 5/00
(52) U.S. Cl. ........................................ 372/45; 372/46
(58) Field of Search ................................ 372/45, 46

(56) References Cited

U.S. PATENT DOCUMENTS 4,894,836 A * 1/1990 Hayakawa et al. ........... 372/45
5,070,510 A * 12/1991 Konushi et al. .............. 372/46
5,561,301 A * 10/1996 Inoue ......................... 372/45

* cited by examiner

*Primary Examiner*—Quyen Leung
(74) *Attorney, Agent, or Firm*—Oblon, Spivak, McClelland, Maier & Neustadt, P.C.

(57) ABSTRACT

A semiconductor laser device having high optical output power is provided. The semiconductor laser device has an n-type lower cladding layer, a lower optical confinement layer, an active layer having a quantum well structure, an upper optical confinement layer, a Zn-doped p-type upper cladding layer, and a cap layer formed on an n-type semiconductor substrate in this order. A nondoped semiconductor layer having a thickness of 10 to 100 nm, in particular, a nondoped InP layer, is interposed between the upper optical confinement layer and the Zn-doped p-type upper cladding layer.

10 Claims, 2 Drawing Sheets

SEMICONDUCTOR LASER DEVICE

BACKGROUND OF THE INVENTION

1. Field of the Invention

The present invention relates to a semiconductor laser device which has an active layer of a multi-quantum well structure.

2. Prior Art

A semiconductor laser device which has a quantum well structure as an active layer, i.e., as a light emitting region is known to oscillate at a lower threshold current and operates with higher power as compared with a semiconductor laser device having an active layer formed of a bulk semiconductor material.

An example of such a laser device is illustrated in FIG. 1.

The illustrated laser device has a buried hetero structure. Specifically, the laser device has a mesa-type layered structure which comprises an n-type semiconductor substrate 1, and an n-type lower cladding layer 2, a nondoped lower optical confinement layer 3, an active layer of quantum well structure 4, a nondoped upper optical confinement layer 5, p-type upper cladding layers 6A, 6B and a p-type cap layer, which are sequentially grown on the semiconductor substrate 1, for example, by a crystal growth method such as an MOCVD method.

Also, current blocking layers 8 are formed on both sides of the mesa-type layered structure by sequentially growing a p-type layer 8A and an n-type layer 8B. Then, an n-type electrode (not shown) is formed on the back surface of the substrate 1, and a p-type electrode (not shown) is formed on the cap layer 7, independently.

Here, when an InP substrate is used as the substrate 1, and GaInAsP-based materials are used as materials for the layers sequentially grown on the substrate 1, selenium (Se), sulfur (S) and so on are generally used as an n-type dopant for the n-type lower cladding layer 2, while Zinc (Zn) is generally used as a p-type dopant for the p-type upper cladding layers 6A, 6B. Also, the lower optical confinement layer 3 and the upper optical confinement layer 5 constitute a GRIN-SCH structure for increasing the optical confinement effect and efficiently injecting a current injected from the electrode to the active layer 4. For this reason, the laser device having the layered structure reduces the threshold current and increases the external differential quantum efficiency of the laser device, thereby realizing a high optical output power operation.

Such a semiconductor laser device is mounted on a cooler comprising, for example, a Peltier device and accommodated in a package to assemble a laser module. The assembled laser module is used as a signal light source for an optical communication system, and a pumping light source for an optical fiber amplifier such as an erbium-doped fiber amplifier (EDFA).

In recent years, with rapid development in constructing WDM systems, a laser module serving as a pumping light source for an optical fiber amplifier incorporated in the system is required to have the performance which enables laser light having high optical output power to be output from an output end of an optical fiber that is optically connected to the laser module.

For realizing higher optical output power at the output end of an optical fiber, it is effective to enable a laser device itself, incorporated in a laser module, to operate at high optical output power.

SUMMARY OF THE INVENTION

It is an object of the present invention to provide a semiconductor laser device having a novel layered structure which is capable of operating at higher optical output power as compared with the conventional laser device having the layered structure illustrated in FIG. 1.

To achieve the above object, the present invention provides a semiconductor laser device comprising:

a layered structure having an n-type lower cladding layer, a lower optical confinement layer, an active layer having a quantum well structure, an upper optical confinement layer, a Zn-doped p-type upper cladding layer, and a cap layer grown on an n-type semiconductor substrate in this order; and a nondoped semiconductor layer interposed between the upper optical confinement layer and the Zn-doped p-type upper cladding layer.

DETAILED DESCRIPTION

Figure 1:
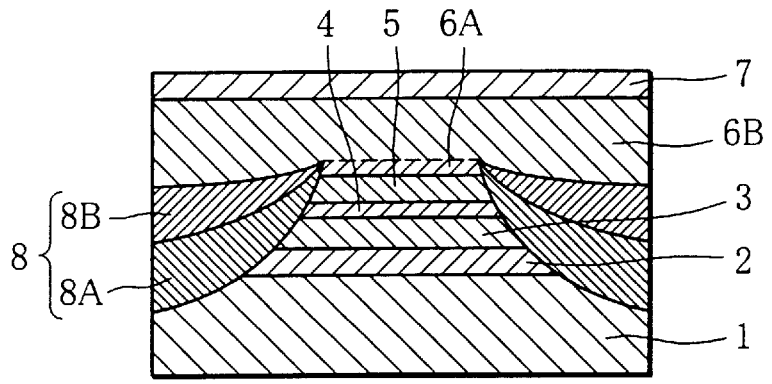
FIG. 1 is a cross-sectional view illustrating an example of layered structure of a prior art semiconductor laser device.
Figure 2:
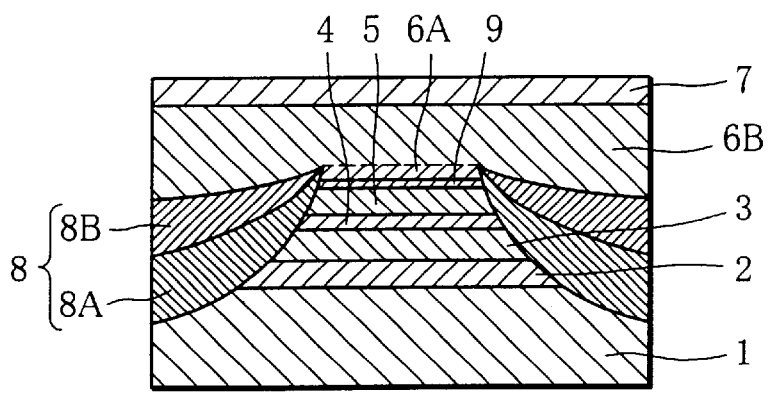
FIG. 2 is a cross-sectional view illustrating an example of a basic layered structure of a semiconductor laser device according to the present invention.

FIG. 2 illustrates an example of a basic layered structure of a laser device according to the present invention. The illustrated layered structure is identical to the conventional structure illustrated in FIG. 1 except for a nondoped semiconductor layer 9, later described, which is interposed as a spacer layer between the upper optical confinement layer 5 and the Zn-doped p-type upper cladding layer 6A.

As appreciated, these layers are all formed, for example, by a known epitaxial crystal growth method such as an MOCVD method, a gas source MBE method, an MBE method, a CBE method or the like.

Also, a combination of semiconductor materials constituting these layers is not particularly limited but may be selected as appropriate depending on a used substrate material.

For example, when the substrate 1 comprises an n-type InP, it is preferable that an Se or S-doped n-type InP may be used as the n-type lower cladding layer 2; a GRIN-SCH structure comprised of a nondoped GaInAsP having a band gap composition wavelength shorter than the active layer as the lower optical confinement layer 3 and the upper optical confinement layer 5; a multi-quantum well structure having a number of wells ranging from one to five, comprised of a nondoped GaInAsP quantum well and a nondoped GaInAsP barrier layer as the active layer; nondoped InP as the nondoped semiconductor layer 9; Zn-doped InP as the Zn-doped p-type upper cladding layer 6A; and Zn-doped GaInAsP as the cap layer 7. In this event, a compressive strained structure of 0.8 to 1.5% is preferably employed as the quantum well structure because this can result in order to achieve higher output power. Alternatively, a strain compensation structure may be preferably employed as the quantum well structure because a compressive strain structure of 1.5% or more can be implemented, thereby obtaining in higher power.

Here, the technical idea of the present invention, which involves the nondoped semiconductor layer 9 interposed between the upper optical confinement layer 5 and the Zn-doped p-type upper cladding layer 6A, is based on the following results of considerations:

(1) First, the inventors noted that the p-type dopant for the p-type upper cladding layer 6A (6B) in the laser device having the layered structure illustrated in FIG. 1 is Zn which has the property of absorbing light.

(2) A simple method of realizing a high power operation of a laser device is to increase a driving current of the laser device. In this event, it is necessary to suppress an overflow of electrons, i.e., prevent electrons from flowing beyond a hetero barrier between the p-type upper optical confinement layer and the p-type upper cladding layer.

Then, for satisfying this condition, it is known to be effective that the hetero barrier between the p-type upper cladding layer and the p-type upper optical confinement layer is made higher by increasing the carrier concentration in the p-type upper cladding layer.

(3) On the other hand, Zn, which is a p-type impurity, has per se the property of absorbing light, and therefore Zn limits an increase in optical output power of the laser device. Since this is in a trade-off relationship with the phenomenon described in the above item (2), an optimal range exists for the amount of doping of Zn into the p-type upper cladding layer.

Particularly, with a laser device having a buried hetero structure, since the current blocking layer and the upper cladding layer are formed after the mesa-type layered structure including the active layer has been formed, a re-growth process is performed. In this process, Zn diffuses into the p-type upper optical confinement layer due to thermal diffusion of Zn at a growth temperature. This causes a lower hetero barrier between the p-type upper cladding layer and the p-type upper optical confinement layer to increase the overflow of electrons flowing beyond the hetero barrier, reduce the saturation current, limit the high power operation, and give rise to a further reduction in the optical output power.

(4) As a result, light absorption is increased in the p-type upper optical confinement layer, causing a reduction in the optical output power of the laser device.

(5) It is therefore contemplated that higher optical output power can be realized by interposing a means capable of suppressing the occurrence of the situation as described on a hetero interface between the p-type upper cladding layer 6A and the upper optical confinement layer 5.

The layered structure illustrated in FIG. 2 has been developed based on the considerations described above.

In the illustrated layered structure, a dopant can be doped into the upper cladding layer 6A in a higher concentration by interposing the nondoped semiconductor layer 9. Since a high hetero barrier height can be realized, electrons can be prevented from overflowing. Also, since the nondoped semiconductor layer 9 also works as a layer for suppressing the diffusion of Zn due to the heat during the regrowth process of the buried structure, the absorption of light by Zn can also be suppressed.

As the nondoped semiconductor layer 9 may be made of materials as follows when the substrate 1 is an n-type InP substrate, other than the aforementioned nondoped InP.

For example, used as the layer 9 may be nondoped GaInAsP which has the band gap composition wavelength ($\lambda$g) in a range of 0.92 to 1.1 $\mu$m. Also, while a layer of GaInAsP may be a layer of a single composition, this may be a composition gradated layer formed by growing a plurality of layers in which compositions change continuously or in steps toward a shorter wavelength composition from the p-type upper optical confinement layer to the p-type upper cladding layer.

Then, from the relationship between the thickness and the optical output power, and the relationship between the thickness and the optical output power saturation current value (Isat), the thickness is preferably set in a range of 10 to 100 nm.

When the thickness is smaller than 10 nm, a current value at which the optical output power saturates, i.e., the optical output power saturation current value (Isat) becomes higher. Although driving the device with a large current is preferable, the aforementioned function of the nondoped semiconductor layer 9 is declined. Also, due to thermal diffusion of Zn, the optical output power is reduced because of light absorption in the Zn-doped p-type upper cladding layer 6A and the upper optical confinement layer 5 into which Zn atoms diffuse.

On the other hand, when the thickness is made larger than 100 nm, the electric resistance of the nondoped semiconductor layer 9 becomes higher since this layer is not doped. This results in a larger series resistance component of the laser device, and occurrence of thermal saturation due to heat generated by the larger resistance, thereby giving rise to a reduction in the optical output power. In addition, the Isat value is reduced to degrade the driving performance of the laser device and to degrade laser reliability during the large current operation due to the heat generation on the laser chip.

A more preferred thickness for the nondoped semiconductor layer 9 is in a range of 20 to 90 nm.

EXAMPLES

Figure 3:
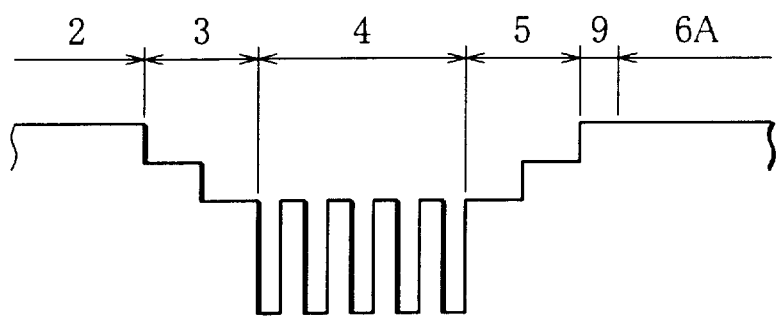
FIG. 3 is a band diagram on the conduction band side in the layered structure of FIG. 2.

A semiconductor laser device which oscillates in a wavelength range of 1480 nm, has the layered structure illustrated in FIG. 2, and presents a band diagram on the conduction band side as shown in FIG. 3 was fabricated as follows.

On a (100) surface of a substrate 1 made of n-type InP, an n-type lower cladding layer 2 of 1.0 $\mu$m thick made of Se-doped n-type InP (the doping concentration of Se is $1 \times 10^{18}$ cm$^{-3}$); and a lower optical confinement layer 3 of 40 nm thick made of nondoped InGaAsP (comprised of two layers with $\lambda$g=1.05 $\mu$m and $\lambda$g=1.15 $\mu$m) were deposited in sequence by an MOCVD method. Further, on the lower optical confinement layer 3, an active layer 4, later described, and an upper optical confinement layer 5 of 40 nm thick made of nondoped InGaAsP (comprised of two layers with $\lambda$g=1.05 $\mu$m and $\lambda$g=1.15 $\mu$m) were deposited in sequence.

Here, the active layer 4 was comprised of a well layer of 4 nm thick made of GaInAsP having a compressive strain with the amount of strain equal to 1%, and a barrier layer of 10 nm thick made of GaInAsP having a band gap composition wavelength $\lambda$g equal to 1.15 $\mu$m. The active layer 4 had a multi-quantum well structure with the number of wells equal to five.

Next, on the aforementioned upper optical confinement layer 5, a nondoped InP layer 9 having a different thickness was deposited using nondoped InP, and a Zn-doped p-type upper cladding layer 6A of 0.5 μm thick made of Zn-doped InP (the doping concentration of Zn is $7 \times 10^{17}$ cm$^{-3}$) was grown.

The resulting layered structure was processed by photolithography and wet etching to form a mesa structure. Subsequently, current blocking layers 8, comprised of a p-type InP layer 8A and an n-type InP layer 8B were formed on both sides of the mesa structure by a re-growth process using an MOCVD method. Then, a p-type InP cladding layer 6B of 3 μm thick and a cap layer 7 of 0.5 μm thick made of p-type GaInAsP were deposited in sequence.

Next, a p-type electrode made of Ti/Pt/Au was formed on the cap layer 7. The back surface of the substrate 1 was polished to reduce the overall thickness to approximately 100 μm. Then, an n-type electrode made of Au—Ge/Ni/Au was formed on the polished surface.

Subsequently, the whole structure was cleaved to define the cavity length to be 1000 μm. A lower reflective film having a reflectance of 5% was deposited on a front facet, while a high reflective film having a reflectance of 98% was deposited on a rear facet to create a variety of laser devices.

Figure 4:
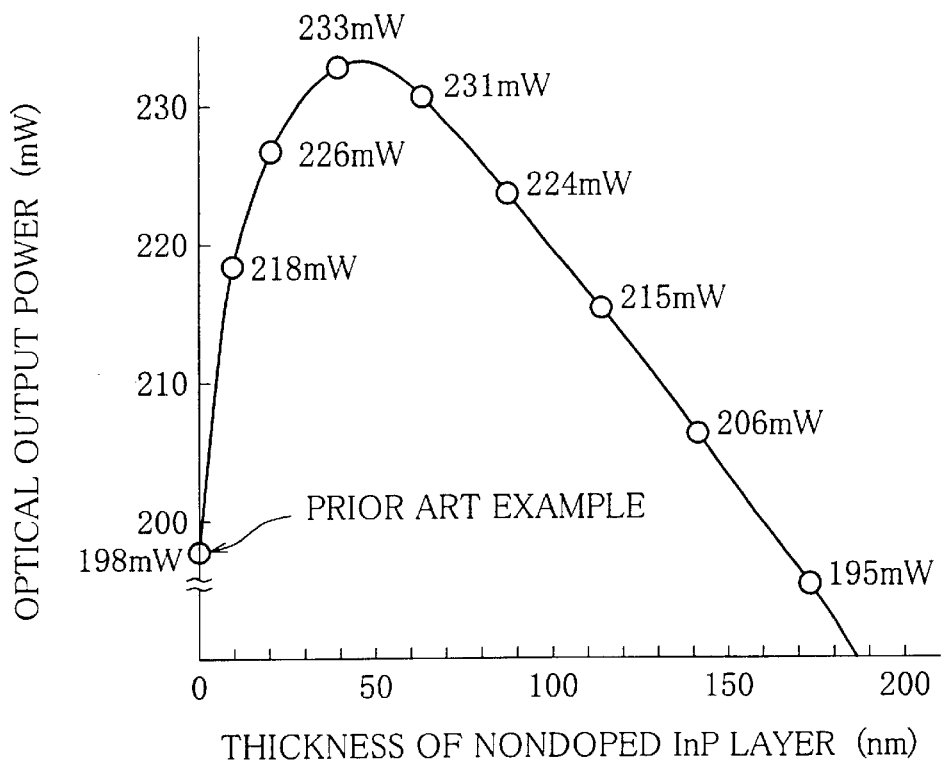
FIG. 4 is a graph showing the relationship between the optical output power and the thickness of a nondoped semiconductor layer.
Figure 5:
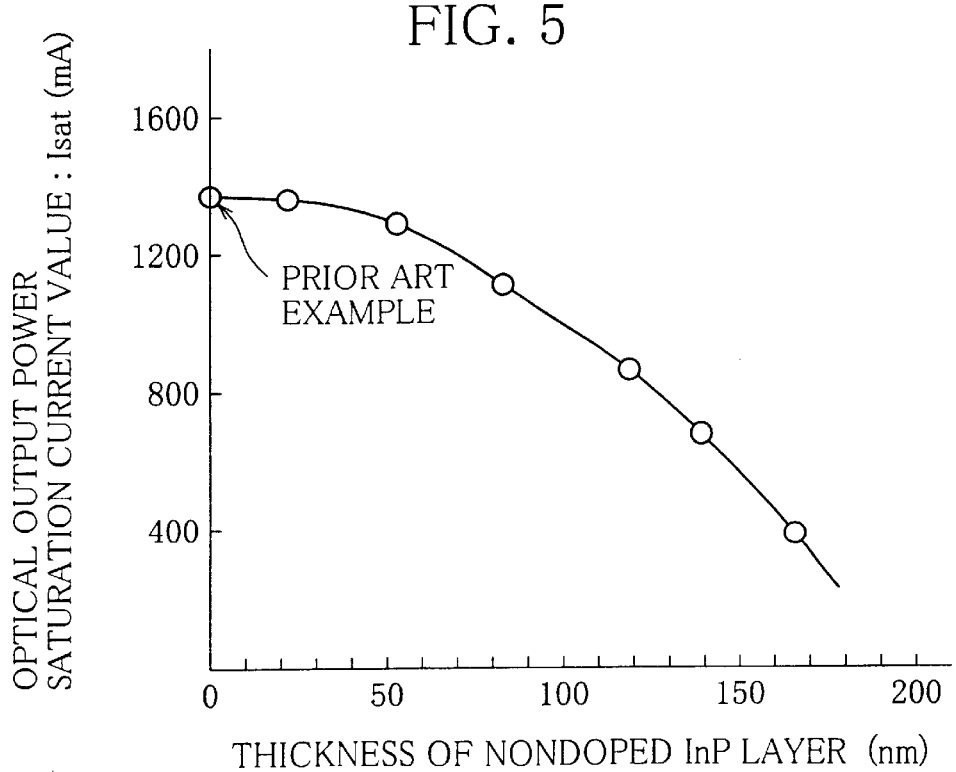
FIG. 5 is a graph showing the relationship between an optical output power saturation current value (Isat value) and the thickness of a nondoped semiconductor layer.

The optical output power was measured when an injection current into these laser devices was 600 mA. The result is shown in FIG. 4 as a relationship between the thickness of the nondoped semiconductor layer 9 and the optical output power. Also, the relationship between the Isat value of each laser device and the thickness of the nondoped semiconductor layer 9 is shown in FIG. 5. It should be noted that each characteristic value is an average of seven laser devices.

The followings are apparent from FIGS. 4 and 5.

(1) The prior art example, which does not have the nondoped semiconductor layer between the upper optical confinement layer and the Zn-doped p-type InP layer, provides the optical output merely on the order of 200 mW. On the other hand, the laser device of the present invention provides maximum optical output power of 233 mW, realizing higher optical output power by about 17% as compared with the prior art example. In other words, the effectiveness resulting from the interposition of the nondoped semiconductor layer is evident.

(2) In the laser device of the present invention, as is apparent from FIG. 4, the correlation exists between the optical output power and the thickness of the nondoped semiconductor layer. Specifically, since the absorption of light by Zn is suppressed more as the nondoped semiconductor layer 9 has a larger thickness, the optical output power is accordingly increased, and the maximum optical output power is provided when the thickness is 50 nm. However, as the nondoped semiconductor layer 9 has a thickness larger than 50 nm, the optical output power is gradually reduced due to thermal saturation, and becomes equivalent to the optical output power of the prior art example when the nondoped semiconductor layer 9 has a thickness of approximately 160 nm.

(3) From the foregoing, the thickness of the nondoped semiconductor layer is preferably set in a range of 10 to 100 nm for providing higher optical output power.

(4) It can be seen from FIG. 5 that the optical output power saturation current value Isat is reduced as the thickness of the nondoped semiconductor layer becomes larger, causing difficulties in driving the laser device with a large current.

The reason for the difficulties may be described as follows. As the thickness of the nondoped semiconductor layer is larger, the laser device has a larger series resistance component which would generate heat to give rise to thermal saturation. Also, increased overflow of electrons results in lower optical output power as well as a lower Isat value.

Therefore, as is apparent from FIGS. 4, 5, the thickness of the nondoped semiconductor layer is advantageously set in a range of 10 to 100 nm for driving the laser device with a large driving current of 1000 mA or more. More preferably, the thickness of the nondoped semiconductor layer is set in a range of 20 to 90 nm, thereby making it possible to realize a laser device with operates with high power and large driving current.

As is apparent from the foregoing description, the semiconductor laser device according to the present invention provides the optical output power which is higher by approximately 17% as compared with the conventional laser device having the layered structure illustrated in FIG. 1. Thus, the laser device of the present invention is useful as a pumping light source for an optical fiber amplifier. Also, the laser device of the present invention has a large industrial worth as a light source for a system which is required to provide a pumping light intensity on the order of watt (W), just like a Raman amplifier coupled with a fiber Bragg grating.

What is claimed is:

1. A semiconductor laser device comprising:

a layered structure having an n-type lower cladding layer, a lower optical confinement layer, an active layer having a quantum well structure, an upper optical confinement layer, a Zn-doped p-type upper cladding layer, and a cap layer grown on an n-type semiconductor substrate in this order, wherein said upper cladding layer is formed by a re-growth process; and a nondoped semiconductor layer interposed between said upper optical confinement layer and said Zn-doped p-type upper cladding layer, wherein said nondoped semiconductor layer has the same band gap composition wavelength of the upper cladding layer and said nondoped semiconductor layer has a thickness of 10 to 100 nm, and wherein a total thickness of the upper optical confinement layer and the nondoped semiconductor layer is larger than a thickness of the lower optical confinement layer.

2. The semiconductor laser device according to claim 1, wherein:

said quantum well structure is a multi-quantum well structure.

3. The semiconductor laser device according to claim 1, wherein:

said quantum well structure is a strain quantum well structure.

4. The semiconductor laser device according to claim 1, wherein:

said quantum well structure is a strain compensated quantum well structure.

5. The semiconductor laser device according to claim 1, wherein:

said quantum well structure is a compressive strain quantum well structure having the amount of strain in a range of 0.8 to 1.5%.

6. A semiconductor laser device comprising:

a layered structure having an n-type lower cladding layer, a lower optical confinement layer, an active layer having a quantum well structure, an upper optical confinement layer, a Zn-doped p-type upper cladding layer, and a cap layer grown on an n-type semiconductor substrate in this order, wherein said upper cladding layer is formed by a re-growth process; and a nondoped semiconductor layer interposed between said upper optical confinement layer and said Zn-doped p-type upper cladding layer, wherein said nondoped semiconductor layer is either a layer of a single composition comprised of nondoped InP, or a layer of a single composition comprised of nondoped GaInAsP having a band gap composition wavelength of 0.92 to 1.1 microns, or a composition gradated layer comprised of a plurality of nondoped GaInAsP having different compositions, and wherein a total thickness of the upper optical confinement layer and the nondoped semiconductor layer is larger than a thickness of the lower optical confinement layer.

7. The semiconductor laser device according to claim 6, wherein:

said quantum well structure is a multi-quantum well structure.

8. The semiconductor laser device according to claim 6, wherein:

said quantum well structure is a strain quantum well structure.

9. The semiconductor laser device according to claim 6, wherein:

said quantum well structure is a strain compensated quantum well structure.

10. The semiconductor laser device according to claim 6, wherein:

said quantum well structure is a compressive strain quantum well structure having the amount of strain in a range of 0.8 to 1.5%.

* * * * *